United States Patent [19]
Pierrat

[11] Patent Number: 5,922,497
[45] Date of Patent: Jul. 13, 1999

[54] LITHOGRAPHIC IMAGING SYSTEM

[75] Inventor: Christophe Pierrat, Boise, Id.

[73] Assignee: Micron Technology, Inc., Boise, Id.

[21] Appl. No.: 09/006,236

[22] Filed: Jan. 13, 1998

[51] Int. Cl.⁶ ........................................................ G03F 9/00
[52] U.S. Cl. ................................................................ 430/5
[58] Field of Search ................................. 430/5, 322, 324

[56] References Cited

U.S. PATENT DOCUMENTS 5,686,209  11/1997  Iwamatsu et al. ........................... 430/5

*Primary Examiner*—S. Rosasco
*Attorney, Agent, or Firm*—Trop, Pruner, Hu & Miles, PC

[57] ABSTRACT

A layer applied over the reticle used in a lithographic system can improve the image quality of the system. The applied layer may have a thickness of approximately the wavelength of incident light divided by four times its index of refraction.

42 Claims, 2 Drawing Sheets

LITHOGRAPHIC IMAGING SYSTEM

This invention relates generally to lithographic techniques for forming semiconductor wafers and particularly to improving the resolution of a projected image formed on a wafer by a reticle.

BACKGROUND OF THE INVENTION

Photomasks are used to form an image to be projected onto a silicon wafer treated with photoresist. The photomask typically has a light blocking and transmitting pattern. The photomask may be formed by patterning a mask formed of a metal, such as chrome, that was deposited on a substrate, such as quartz. The patterned substrate, often called a "reticle," may be used to define an image which is projected onto the semiconductor wafer. The photoresist covering the wafer is thereby exposed in the desired pattern. After the pattern is developed, the developed photoresist may be used to define structure such that the original pattern is reproduced in that structure on the semiconductor wafer.

Typically in wafer lithographic systems, a light source is projected through the reticle onto the wafer. The wafer is positioned under control of a device called a stepper. The stepper aligns the reticle to the wafer.

There is a continuing need to improve photolithographic techniques to enable smaller integrated circuits to be fabricated. As smaller integrated circuits are possible, their performance, size and cost may be improved. Successive generations of lithographic techniques used for forming such images have provided increasingly improved resolution and enabled ever smaller devices to be made.

However, these lithographic systems are expensive. Thus, it would be desirable to improve the resolution achievable with a given system without requiring the substantial capital investment to replace and upgrade the equipment.

As light passes through the photomask, some of the light is diffracted at the interface between the masking and nonmasking areas of the pattern. The diffracted light decreases the image resolution of the projected image. As a result, the projected image and the structures formed on the semiconductor wafer may be of diminished quality. Ultimately, the size of the smallest image which can be transferred to the wafer is reduced as a result of this diffraction effect.

SUMMARY OF THE INVENTION

The diffraction effect may be overcome without requiring replacement of the lithographic system by positioning an appropriately designed layer over the reticle. The layer is specially designed to counteract the diffraction effect at the edges of the masking pattern on the photomask.

In accordance with one aspect of the present invention, a reticle includes a light transmitting pattern. The reticle has a light altering member adjacent the light transmitting pattern, the light altering member adapted to alter the phase of a portion of a light projected through the light transmitting pattern.

In accordance with another aspect of the present invention, a reticle includes a reflective member adapted to reflect a light pattern when exposed to a light source. The reticle has a light altering member adjacent the reflective member, the light altering member adapted to alter the phase of a portion of the light diffracted by the reflective member.

In accordance with but another aspect of the present invention, an imaging device includes a light transmitting pattern. The imaging device has a light transmitting member adjacent the light transmitting pattern. The light transmitting member has an exit surface remote from the light transmitting pattern. The distance between the pattern and the exit surface is such that light diffracted by the pattern and reflected from the exit surface to the pattern and back through the exit surface is out of phase with light passing directly through the exit surface.

In accordance with yet another aspect of the present invention, an imaging method includes placing a mask adjacent a first light transmitting member. The thickness of the first light transmitting member is selected such that a portion of light diffracted by the mask is out of phase with light not diffracted by the mask.

In accordance with but another aspect of the present invention, an imaging method includes placing a transmissive member adjacent a photomask, the transmissive member having an exit surface. A light is projected through the photomask and the exit surface. The phase of a portion of the light diffracted by the photomask and reflected by the exit surface is altered.

In accordance with still another aspect of the present invention, an imaging device includes a light source. A mask is adapted to transmit light from the light source and to diffract a portion of the transmitted light. A transmissive member, adjacent the mask opposite the light source, has an exit surface remote from the mask. The exit surface is adapted to reflect a portion of the diffracted light. The transmissive member is adapted to alter the phase of the reflected light.

In accordance with yet another aspect of the present invention, a method of imaging includes interposing a light blocking pattern between a reflective member and a transmissive member. The thickness of the light blocking pattern is such that a first portion of light diffracted by the light blocking pattern is out of phase with a second portion of light reflected by the light blocking pattern.

DESCRIPTION OF THE PREFERRED EMBODIMENTS

Figure 1:
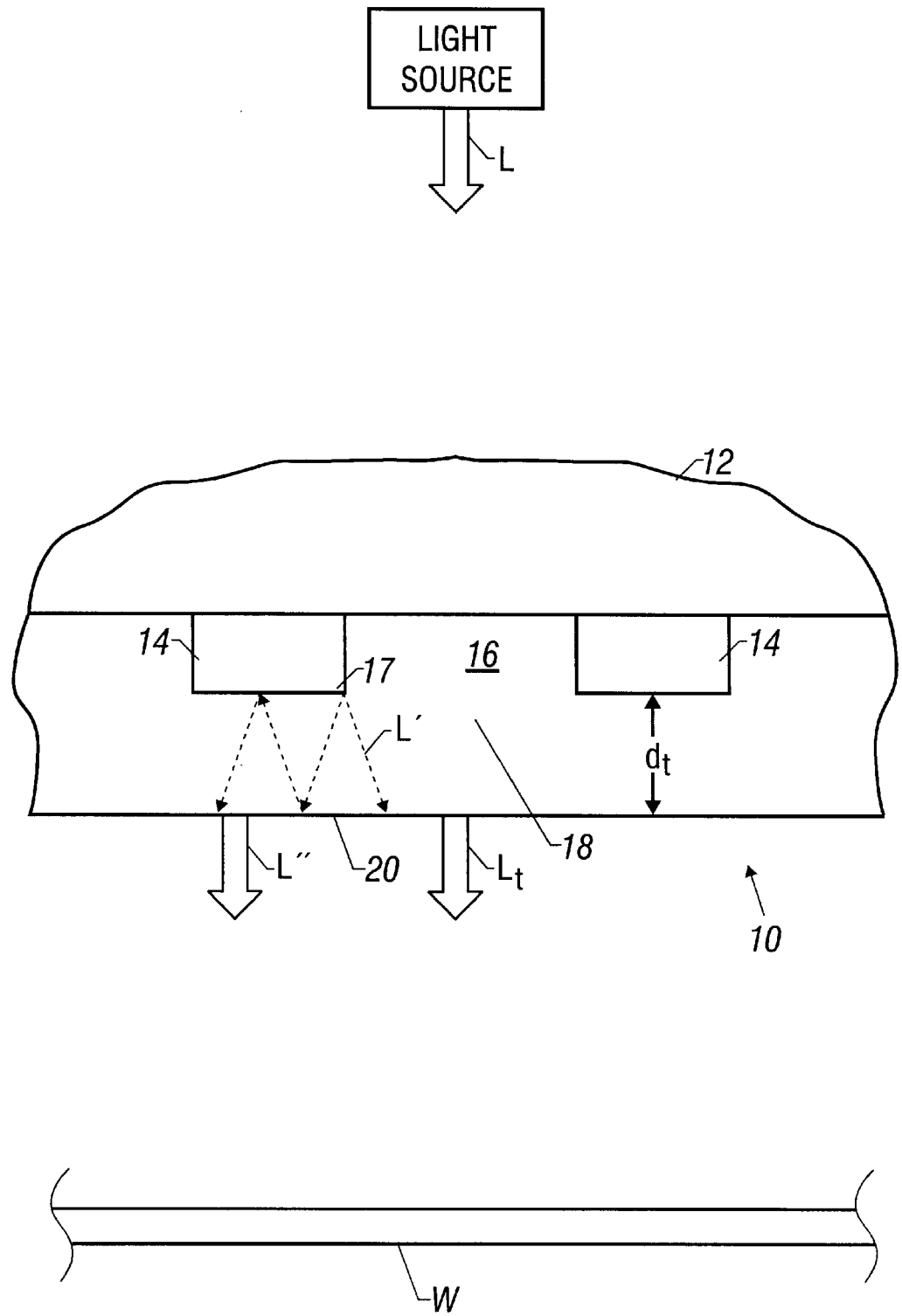
FIG. 1 is a partial, enlarged cross-sectional view of a reticle in a schematically depicted lithographic system.

As shown in FIG. 1, a photolithographic system 10 may include a member 12 having a mask 14 defined thereon. The mask 14 and quartz member 12 together define a reticle. The mask 14 may be formed by any conventional technique including the patterning of a chrome layer. The member 12 may be made of a variety of light transmissive materials including quartz.

The dimensions of elements in the figures may be exaggerated or contracted for illustration purposes. In addition, conventional components such as condenser and projection lenses are omitted for simplicity.

A light source illuminates the member 12. The light source may be any type of light source conventionally used for lithographic purposes including an ultraviolet light source. Preferably, the light source is photon based and produces light "L" in the wavelength traditionally associated with visible or ultraviolet light, including deep ultraviolet. While an on-axis light source is illustrated, off-axis light sources may be used as well.

Incident light L formed by the light source passes through the reticle formed of the member 12 and mask 14. The light is blocked by the mask 14 and transmitted through openings 16 in the mask. As the light passes through the openings 16 in the mask, it is diffracted, as indicated at L', at the mask edges 17.

A layer 18 adjacent the mask 14 enhances the resolution possible with an existing reticle. The layer 18 may be substantially light transmissive, allowing a substantial percentage of the incident light L to pass through the layer 18.

The layer 18 may be a layer of quartz sputter deposited on the mask 14. Alternatively, the member 12 and the mask 14 may be deposited on a previously formed layer 18. The deposition of quartz layers may also be accomplished by chemical vapor deposition. The layer 18 may also be made of silicon nitride. In some cases, it may be advantageous to form the layer 18 of multiple layers. In other embodiments, the layer 18 may be a discrete plate of transmissive material placed adjacent the mask 14.

A portion of the diffracted light L' is reflected upwardly from the lower surface 20 of the layer 18, towards the mask 14 where it is then reflected from the mask 14 back through the exit surface 20 towards the wafer "w".

The distance "$d_t$" between the mask 14 and the surface 20 is such that the diffracted and reflected light L" passing through the surface 20 of the layer 18 is out of phase with the transmitted light $L_t$.

The distance $d_t$ is advantageously approximately equal to the wavelength of the light L divided by four times the refractive index of the layer 18. The light L" is then 180° out of phase with the light $L_t$.

Advantageously, a substantial portion of the diffracted light L' is reflected back from the surface 20 to create an out of phase component L". If the out of phase light L" is too insubstantial, the image enhancing effect may be insubstantial. On the other hand, if the amount of diffracted and reflected light L" is too high, other resolution problems may be created. Thus, it is most desirable that the ratio of the out of phase light L" to the in phase light $L_t$ be less than about 0.25 and greater than about 0.05. The transmitted light may be determined as a percentage of the intensity of the original light source light L.

As in any lithographic system, it is desirable that Sigma (σ), the ratio of the image of the light source on the projection lens pupil over the numerical aperture of the pupil on the projection lens, be less than about 0.5.

With the embodiment described above, existing lithographic systems can be upgraded to improve their resolution with a given light source wavelength. This avoids or delays the expense of replacing prior generation lithographic systems with more recent generation systems. In addition, up to date systems may achieve even greater performance through inclusion of the image enhancing layer.

With an appropriately designed layer 18, the amplitude profile on the wafer is sharper and the printability of the pattern is improved.

Figure 2:
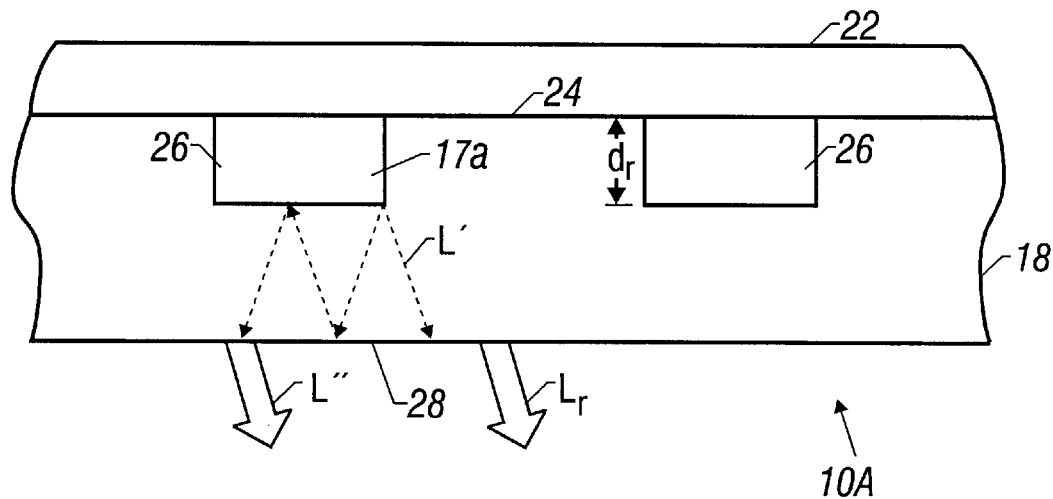
FIG. 2 is a partial, enlarged cross-sectional view of a reticle in another photolithographic system indicated schematically.
Figure 2:
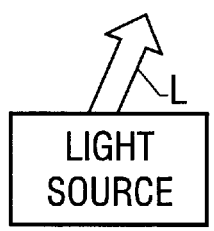
Figure 2:
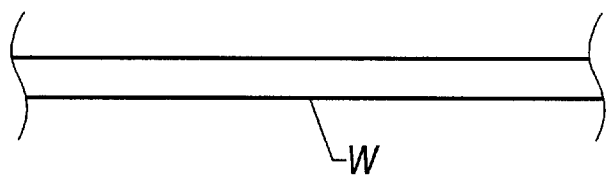

As shown in FIG. 2, the same effect can be achieved in a system 10a relying on reflection of light rather than transmission of light. In this case, the incident light L is either reflected at the interface 24 or absorbed by the mask 26. Other combinations of optical effects could be utilized as well, including using a reflective mask 26 and an absorptive material 24.

The light source may be situated slightly off-axis. The wafer "w" then must be slightly skewed to align with the light $L_r$ reflected from the layer 22. Any conventionally reflective surface may be used as the layer 22, including a silver coating.

The thickness $d_r$ of the layer 26 is governed by the same relationship described above. Namely, $d_r$ is advantageously equal to about the wavelength of the incident light L divided by four times the index of refraction of the layer 18. This produces 180° out of phase light L" which improves the printability of the resulting image. Similarly, the ratio of the light L" diffracted by the edge 17a and reflected by the exit surface 28 and ultimately reflected again off the mask 26, divided by the reflected light $L_r$ should be maintained in the range of less than about 0.25 and greater than about 0.05.

Since the layer 18 may be economically added to existing optical systems, the present invention offers an extremely cost effective solution which may also satisfy the need for ever increasing resolution in lithographic systems.

While the present invention has been described with respect to a limited number of preferred embodiments, those skilled in the art will appreciate numerous modifications and variations therefrom. It is intended that the appended claims cover all such modifications and variations as fall within the true spirit and scope of the present invention.

What is claimed is:

1. A reticle comprising:

a light transmitting pattern; and a light altering member adjacent said light transmitting pattern, said light altering member adapted to alter the phase of a portion of a light projected through said light transmitting pattern.

2. The reticle of claim 1 wherein:

said light altering member has a refractive index;

said light altering member having a surface opposite said light transmitting pattern; and the distance between said pattern and said surface being approximately equal to the wavelength of said light divided by four times said refractive index.

3. The reticle of claim 1 wherein said light transmitting pattern is a photomask mounted on a support layer, said light altering member mounted on said mask.

4. The reticle of claim 1 wherein said light altering member is quartz.

5. The reticle of claim 4 wherein said light altering member is vapor deposited quartz.

6. The reticle of claim 4 wherein said light altering member is a sputter deposited quartz.

7. The reticle of claim 1 adapted to produce an in phase and out of phase light component.

8. The reticle of claim 7 wherein the ratio of the out of phase to the in phase component is greater than approximately 0.05.

9. The reticle of claim 8 wherein the ratio is less than approximately 0.25.

10. The reticle of claim 8 wherein said out of phase component is 180° out of phase.

11. The reticle of claim 1 wherein said light altering member is deposited over said pattern.

12. A reticle comprising:

a reflective member adapted to selectively reflect light when exposed to a light source; and a light altering member adjacent said reflective member, said light altering member adapted to alter the phase of a portion of the light diffracted by said reflective member.

13. The reticle of claim 12 wherein said light altering member has a refractive index;

said reflective member includes a photomask;

said light altering member has a pair of surfaces one farther from said light reflective member; and the thickness of said photomask being approximately equal to the wavelength of said light divided by four times said refractive index.

14. The reticle of claim 12 wherein said reflective member includes a photomask, said light altering member mounted on said mask.

15. The reticle of claim 14 wherein said light altering member is deposited over said photomask.

16. The reticle of claim 12 wherein said light altering member is quartz.

17. The reticle of claim 16 wherein said light altering member is vapor deposited quartz.

18. The reticle of claim 16 wherein said light altering member is a sputter deposited quartz.

19. The reticle of claim 12 adapted to produce an in phase and out of phase light component.

20. The reticle of claim 19 wherein the ratio of out of phase to the in phase component is greater than approximately 0.05.

21. The reticle of claim 20 wherein said out of phase component is 180° out of phase.

22. The reticle of claim 12 wherein the ratio is less than approximately 0.25.

23. An imaging device comprising:

a light transmitting pattern; and a light transmitting member adjacent said light transmitting pattern, said light transmitting member having an exit surface remote from said light transmitting pattern, the distance between said pattern and said exit surface being such that light diffracted by said pattern and reflected from said exit surface to said pattern and back through said exit surface is out of phase with light passing directly through said exit surface.

24. The imaging device of claim 23 wherein said light transmitting member has a refractive index and the distance between said pattern and said exit surface being approximately equal to the wavelength of light projected through said pattern divided by four times said refractive index.

25. The imaging device of claim 23 wherein said light transmitting pattern is a photomask mounted on a support layer, said light altering member formed over said mask.

26. The imaging device of claim 23 including a light altering member.

27. The imaging device of claim 26 wherein said light altering member is quartz.

28. The imaging device of claim 27 wherein said light altering member is a deposited quartz.

29. The imaging device of claim 26 wherein said light altering member is deposited over said pattern.

30. The imaging device of claim 23 adapted to produce an in phase and out of phase light component.

31. The imaging device of claim 30 wherein the ratio of out of phase to the in phase component is greater than approximately 0.05.

32. The imaging device of claim 31 wherein the ratio is less than approximately 0.25.

33. An imaging method comprising:

placing a mask adjacent a first light transmitting member; and selecting the thickness of said first light transmitting member such that a portion of light diffracted by said mask is out of phase with light not diffracted by said mask.

34. The method of claim 33 including placing a second light transmitting member adjacent said mask opposite said first light transmitting member, and transmitting light through said mask.

35. The method of claim 34 including reflecting said diffracted light off of said mask.

36. The method of claim 34 wherein the first light transmitting member has a refractive index and the thickness of said first light transmitting member having a thickness approximately equal to the wavelength of said light divided by four times said refractive index.

37. The method of claim 34 wherein said first light transmitting member is a plate.

38. An imaging method comprising:

placing a transmissive member adjacent a photomask, said transmissive member having an exit surface;

projecting a light through said photomask and said exit surface; and altering the phase of a portion of said light diffracted by said photomask and reflected by said exit surface.

39. The method of claim 38 including reflecting said portion of said light from said photomask.

40. An imaging device comprising:

a light source;

a mask, said mask adapted to transmit light from said light source, said mask adapted to diffract a portion of said transmitted light;

a transmissive member adjacent said mask opposite said light source, said transmissive member having an exit surface remote from said mask, said exit surface adapted to reflect a portion of said diffracted light, said transmissive member adapted to alter the phase of said reflected light.

41. A method of imaging comprising:

interposing a light blocking pattern between a reflective member and a transmissive member; and selecting the thickness of said light blocking pattern such that a first portion of light diffracted by said light blocking pattern is out of phase with a second portion of light reflected by said light blocking pattern.

42. The method of claim 41 wherein said transmissive member has a refractive index and said pattern thickness is approximately equal to the wavelength of said light divided by four times said refractive index.

* * * * *

UNITED STATES PATENT AND TRADEMARK OFFICE
CERTIFICATE OF CORRECTION

PATENT NO. : 5,922,497
DATED      : July 13, 1999
INVENTOR(S): Christophe Pierrat It is certified that error appears in the above-identified patent and that said Letters Patent are hereby corrected as shown below:

In column 1, line 2, please insert the following:

STATEMENT AS TO FEDERALLY SPONSORED RESEARCH

This invention was made with United States Government support under contract no. MDA972-92-C-0054 awarded by the Advanced Research Projects Agency (ARPA). The United States Government has certain rights in this invention.

Signed and Sealed this

Twenty-second Day of May, 2001

*Attest:*

NICHOLAS P. GODICI

*Attesting Officer*       *Acting Director of the United States Patent and Trademark Office*